United States Patent [19]

Hollan

[11] 4,172,756

[45] Oct. 30, 1979

[54] METHOD FOR THE ACCELERATED GROWTH FROM THE GASEOUS PHASE OF CRYSTALS, AND PRODUCTS OBTAINED IN THIS MANNER

[75] Inventor: Laszlo Hollan, Sevres, France

[73] Assignee: U.S. Philips Corporation, New York, N.Y.

[21] Appl. No.: 762,876

[22] Filed: Jan. 27, 1977

[30] Foreign Application Priority Data

Feb. 6, 1976 [FR] France .................. 76 03259

[51] Int. Cl.$^2$ ............................................. B01J 17/26
[52] U.S. Cl. ............................... 156/614; 156/DIG. 70
[58] Field of Search ....... 156/614, 610, 609, DIG. 70; 148/175; 252/62.36 A; 29/576 E, 576 T

[56] References Cited

U.S. PATENT DOCUMENTS

| T951,008 | 10/1976 | Regh ............................. 156/614 |
| 3,471,324 | 10/1969 | Wilson et al. .................. 148/175 |
| 3,476,592 | 11/1969 | Berkenblit et al. ............ 156/610 |
| 3,893,876 | 7/1975 | Akai et al. ...................... 148/175 |
| 3,975,218 | 8/1976 | Ruehrwein ..................... 148/175 |
| 4,007,074 | 2/1977 | Ogirima ......................... 156/610 |

*Primary Examiner*—Hiram H. Bernstein
*Attorney, Agent, or Firm*—Thomas A. Briody; Edward J. Connors, Jr.

[57] ABSTRACT

A method of growing gallium arsenide crystals obtained by reaction of a first gaseous phase containing hydrogen and arsenic trichloride and a liquid gallium phase, in which the reaction forms a second gaseous phase from which gallium arsenide is deposited in such circumstances that the molar fraction of arsenic trichloride is larger than $2 \times 10^{-2}$ and is preferably between $2 \times 10^{-2}$ and $10^{-1}$.

7 Claims, 6 Drawing Figures

METHOD FOR THE ACCELERATED GROWTH FROM THE GASEOUS PHASE OF CRYSTALS, AND PRODUCTS OBTAINED IN THIS MANNER

The invention relates to a method of growing gallium arsenide crystals which are obtained by reaction of a first gaseous phase comprising hydrogen and arsenic trichloride, with a liquid phase of gallium, the said reaction forming a second gaseous phase from which the gallium arsenide is deposited.

The invention also relates to the manufacture of semiconductor devices having a monocrystalline substrate and monocrystalline layers which are deposited according to the above-described methods, as well as to products or devices obtained by using said methods.

The growth of layers of semiconductor material from the gaseous phase generally occurs by directing the reacting gases containing the element or the elements of the material to be deposited onto a substrate or surface which is brought at a given temperature which is lower than that of the reaction gases.

The present invention only relates to gallium arsenide (Ga As). Known methods of depositing III-V compounds from the gaseous phase, and more in particular Ga As, are described in numerous journals or patents and as an example is stated the article by Tatsuo Aoki in "Japanese Journal of Applied Physics", vol. 14, No 9, September 1975, pages 1267 to 1271 entitled "High purity epitaxial Ga As".

According to the prior art the growth rate in the case of the deposition of gallium arsenide from the gaseous phase on a monocrystalline substrate, namely the thicknesses per unit time, is smaller than 20 microns per hour for (100) crystal faces and adjoining faces.

Said growth rate which is obtained for (100) crystal faces and adjoining faces is often too low for an industrial manufacture of such crystal layers. Other crystal faces enable attaining a comparatively high growth rate, but the resulting layers then have no good electrical and crystallographic quality.

It is the object of the present invention to increase the growth rate of gallium arsenide layers and nevertheless to obtain layers of an excellent purity, the residual impurities being not higher than $10^{13}$ atoms per cm$^3$ and the appearance of too large crystal defects being avoided.

The method according to the invention is characterized in that the molar fraction of arsenic trichloride in the first gaseous phase is higher than $2\times 10^{-2}$.

Prior investigations into this subject have demonstrated that with molar fractions between $10^{-5}$ and $10^{-3}$ the growth rate increases and that it subsequently decreases between $10^{-3}$ and $10^{-2}$. As a result of this the invention has a given unexpected character, for between $10^{-2}$ and $10^{-1}$ the growth rate shows a new peak which is significantly higher with a maximum near 100 microns per hour.

The method of crystal growth according to the present invention enables attaining monocrystalline layers which are deposited on a monocrystalline substrate and also polycrystalline bodies.

According to a variation of the invention, the method of manufacturing semiconductor devices which are composed of a monocrystalline substrate and one or several monocrystalline layers which is or are deposited according to the above-described method, is characterized in that a face which encloses an angle of 6 to 12 degrees with the (1, 0, 0) face is chosen as the growth face of the said monocrystalline substrate.

On the one hand, actually, only the (100) crystal faces and the adjoining faces permit obtaining monocrystalline layers of good electrical and crystallographic properties and, on the other hand, sufficiently high growth rates are obtained when the growth face of the layer is a face which encloses an angle of a few degrees with the face (1, 0, 0), for example, a (100) face which encloses an angle of 8 degrees in the (1 1 1) direction, for example, a face near (1 1 7) to (1 1 9).

According to a second variation of the invention the method is characterized in that the molar fraction of arsenic trichloride is lower than $10^{-1}$.

Actually, the curve which describes the variation of the growth rate as a function of the molar fraction, passes through a maximum at values of the molar fraction which are situated between $10^{-2}$ and $10^{-1}$, said maximum being obtained at a value which lies near $3\times 10^{-2}$.

The invention will now be described in greater detail with reference to the accompanying drawing, in which.

Figure 1:
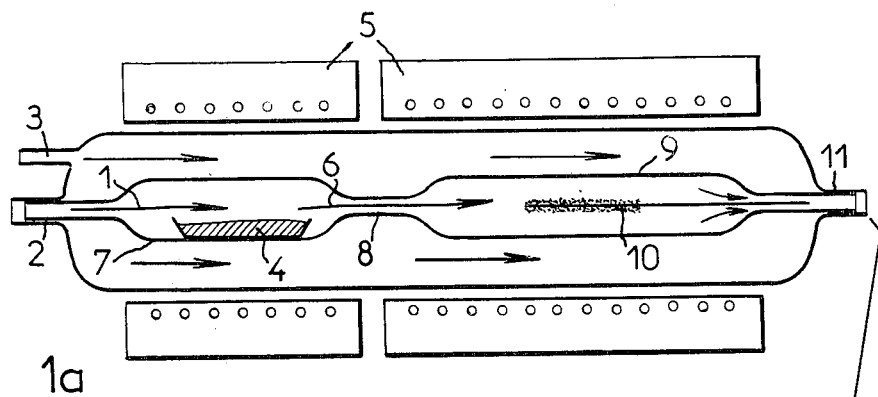
FIG. 1 shows a reactor and the temperature diagram thereof for use of the method according to the invention.
Figure 1:
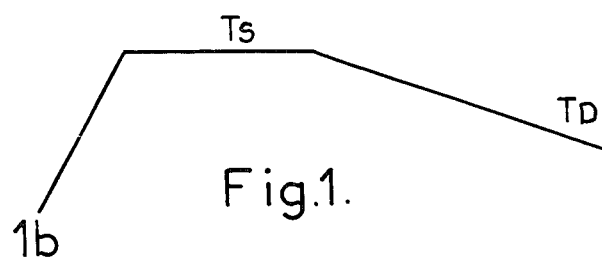

The method of growing gallium arsenide crystals is carried out in a reactor, for example, that which is described in FIG. 1, drawing 1a. A first gaseous phase 1 is led to the inlet of a space 2 via a tube 3, such first gaseous phase comprising hydrogen and arsenic trichloride above a liquid gallium phase 4. A furnace 5 surrounds the space 2 of the reactor, which furnace is formed by two parts, each part forming in its vicinity a temperature zone. The first gaseous phase 1 reacts with the liquid phase 4 to form a second gaseous phase 6 from which the gallium arsenide is deposited.

The general reaction equations describing the reaction and the deposition are written formally (1)  4 AsCl$_3$+6H$_2 \rightleftharpoons$ 12 HCl+As$_4$ (2)  2 Ga+12 HCl$\rightleftharpoons$2 GaCl+H$_2$ (3)  4 GaCl+2H$_2$+As$_4 \rightleftharpoons$ 4 GaAs+4HCl.

In the case in which a polycrystalline deposit is formed, the liquid phase 4 of gallium is in a first insulated space 7, the end 8 of which is inserted into a second insulated space 9. The polycrystalline deposition may be carried out on the walls of the second space 9 or on polycrystalline bodies 10 which were provided previously. The second gaseous phase 6 is exhausted via an outlet tube 11 after deposition. The temperature variation along the reactor is as is shown in FIG. 1b, the temperature of the source $T_s$ being near 800° C. and the deposition temperature in the second space 9 varying gradually from 750° C. to 600° C.

Figure 2:
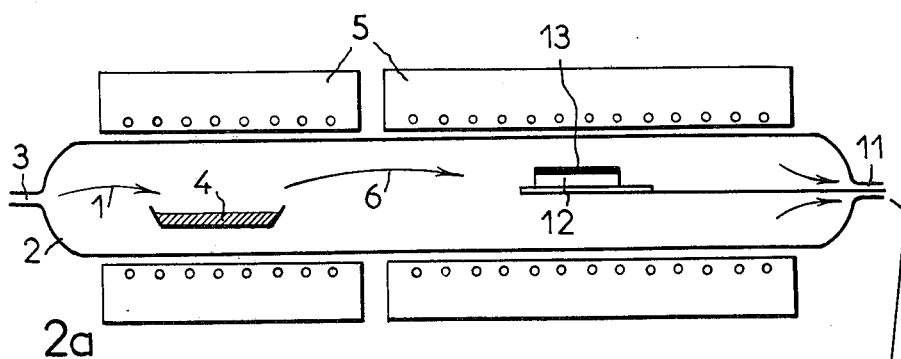
FIG. 2 shows a second reactor and the temperature diagram thereof for use of the method according to the invention.
Figure 2:
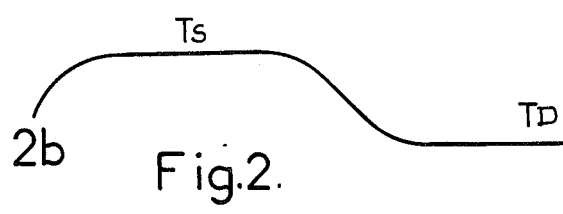

In case of a monocrystalline deposit shown in FIG. 2, a monocrystalline substrate 12 of gallium arsenide on which a layer 13 of GaAs is deposited is placed in the space 2 of the reactor. The temperature variation along the reactor is as is shown in FIG. 2b, the temperature of the source $T_s$ being between 850° C. and 800° C. and that of the deposit $T_d$ being between 750° C. and 720° C.

According to the prior art the rate of the crystalline deposition may be chosen by varying:

the temperatures of the source $T_s$ and of the deposit $T_d$, the molar fraction of AsCl$_3$ and in the case of monocrystalline deposition:

the orientation of the substrate.

As known from the prior art the rate of deposition was a substantially linear function of the temperature difference $\Delta T = T_s - T_d$ and in particular that the rate was zero at $\Delta T = 0$.

The variation of the deposition rate as a function of the molar fraction $MF_{AsCl_3}$ had also been studied previously between $10^{-5}$ and $10^{-2}$. Said curve is shown in FIG. 3 by a solid line.

Figure 3:
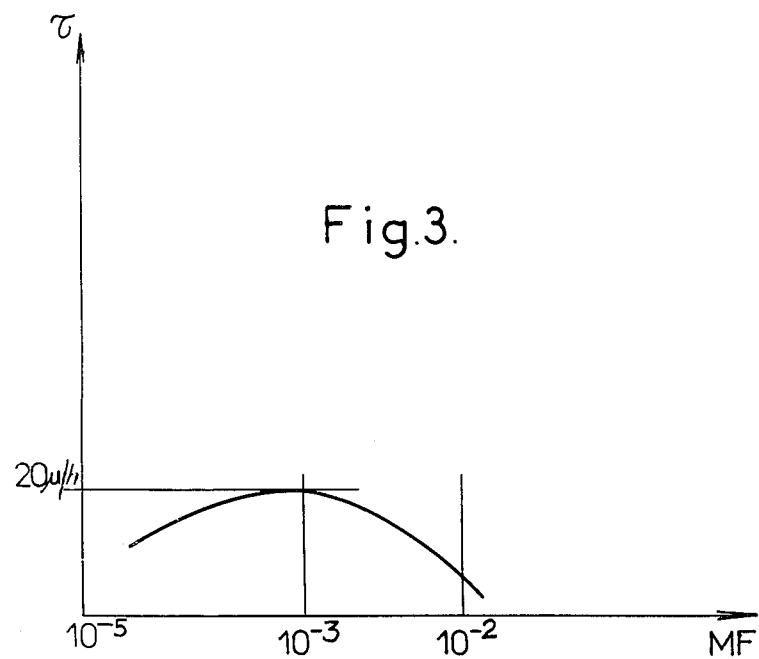
FIG. 3 shows a graph which shows the relationship between the growth rate and the molar fraction of AsCl$_3$ at values lower than $10^{-2}$.

As shown in this FIG. 3, the growth rate denoted symbolically by $\tau$ is plotted on the vertical axis which is a division in microns/hours, the molar fraction of AsCl$_3$ which is shown symbolically by $MF_{AsCl_3}$ being plotted on the horizontal axis according to a logarithmic scale between $10^{-5}$ and $10^{-2}$.

The curve shown as a solid line in the graph denotes the relationship between the growth rate and the molar fraction of AsCl$_3$ at source and deposition temperatures of 770° C. and 720° C., respectively, and a (100) crystal orientation; it will be obvious that other curves which correspond to different test conditions, especially the temperatures of source, of deposition or other crystal orientations than the (100) growth face, however, have an analogous variation and that said curve thus denotes the general variation of the growth rate as a function of the molar fraction.

This curve has been studied previously only for values of MF AsCl$_3$ which are lower than $10^{-2}$. Between the values $10^{-5}$ and $10^{-3}$ the curve thus increases and the growth rate reaches a maximum of approximately 20 microns per hour at said (100) orientation. At higher values between $10^{-3}$ and $10^{-2}$ the curve decreases.

Figure 4:
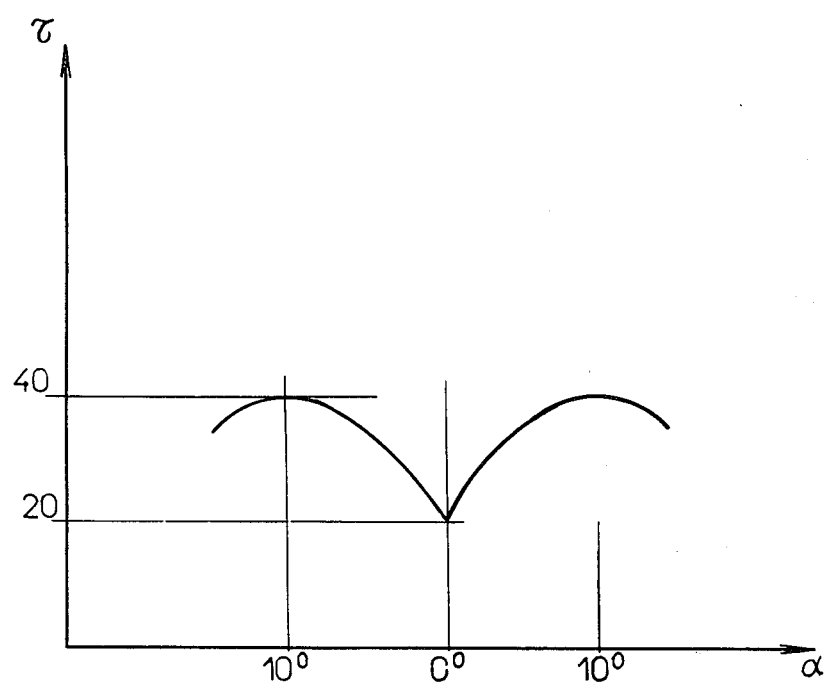
FIG. 4 shows a graph which indicates the relationship between the growth rate and the crystal orientation at a value of the molar fraction of $10^{-3}$.

The variation in rate of deposition as a function of the orientation of the growth face is also known from the prior art and is shown in FIG. 4.

With a molar fraction of $MF_{AsCl_3} = 10^{-3}$ and a temperature difference $\Delta T = T_s - T_d = 100°$ C., the rate of deposition may assume values of 120 microns per hour with a (1, 1, 1) growth face, $\alpha$ denoting the surfaces which are occupied by gallium to 6 microns per hour with a (1, 1, 0) face.

The growth face (100) and the adjacent faces are mainly retained for the manufacture of ultrahigh frequency devices, because said faces correspond to low deposition coefficients which relate to the principal impurities and thus enable to obtaining pure deposits with a controlled doping.

The method of growing gallium arsenide crystals according to the invention is characterized in that the molar fraction of arsenic trichloride in the first gaseous phase (denoted by 1 in FIG. 1a) is higher than $2 \times 10^{-2}$.

Figure 5:
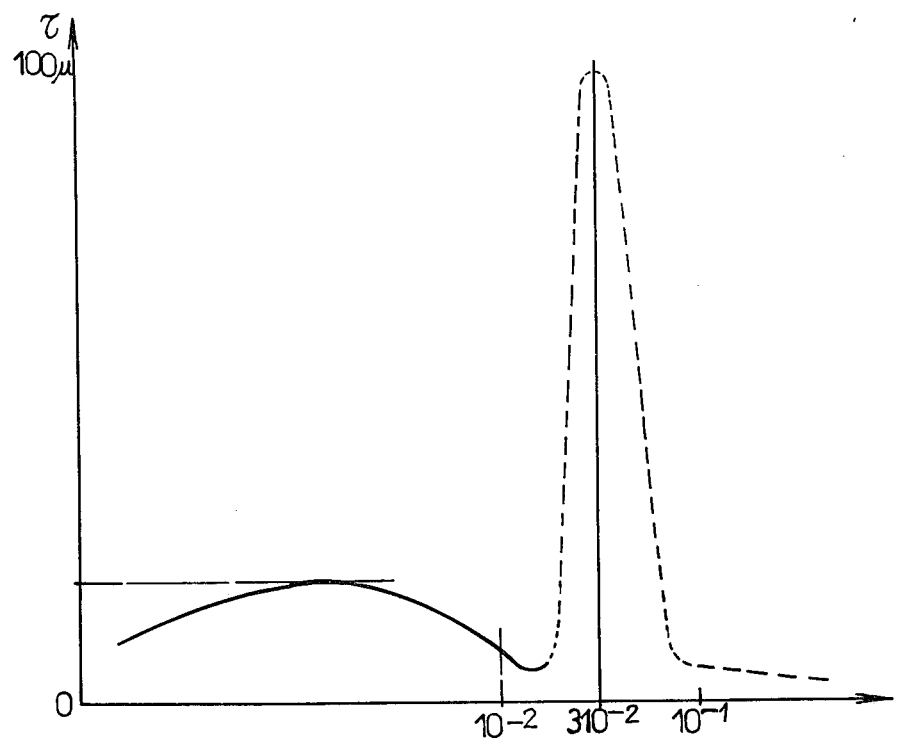
FIG. 5 shows a graph which indicates in broken lines the relationship between the growth rate and the molar fraction of AsCl$_3$ at values which are higher than $2\times 10^{-2}$.

Actually, Applicants have investigated the elongation of the curve shown in FIG. 3 at values of the molar fraction $MF_{AsCl_3}$ which are higher than $2 \times 10^{-2}$. FIG. 5 shows in a solid line the known part of said curve and in a broken line the new part at values of $MF_{AsCl_3}$ situated between $2 \times 10^{-2}$ and $10^{-1}$. Said curve shows an unexpected effect, namely that it is minimum between 0.8 and $1 \times 5 \, 10^{-2}$, increases unexpectedly at $2 \times 10^{-2}$ to reach a maximum in the proximity of $3 \times 10^{-2}$ and then decreases.

Figure 6:
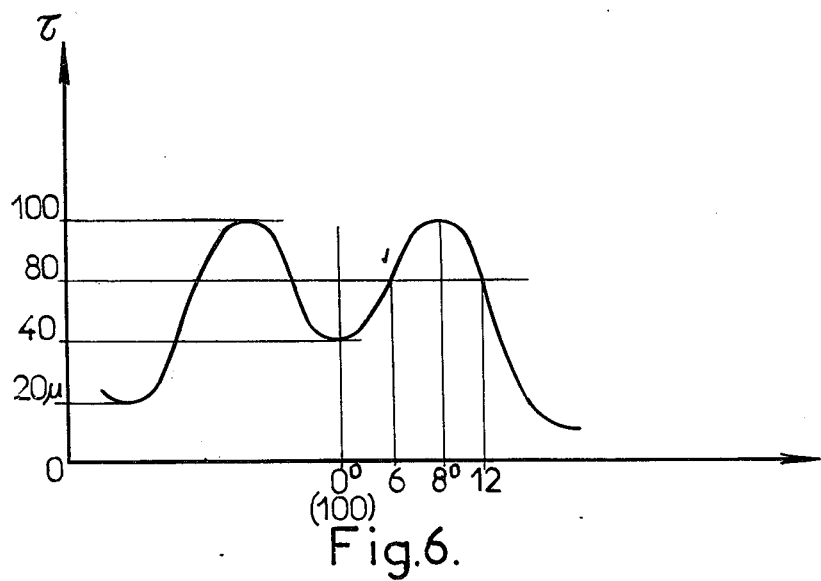
FIG. 6 shows the variation of the growth rate in growth faces which lie near the (1, 0, 0) face at a value of the molar fraction of $3\times 10^{-2}$.

Applicants have also investigated the variations of the maximum of the preceding curve with orientations near the (1, 0, 0) face. For this purpose, there have been investigated the variation of the rate of deposition as a function of the angle which the growth face makes with the (1, 0, 0) face at fixed values of $\Delta T = 70°$ C. and $MF_{AsCl_3} = 3 \times 10^{-2}$. These variations are shown in FIG. 6.

A method of manufacturing a semiconductor device is characterized in that a growth face is chosen which makes an angle of 6° to 12° with the (1, 0, 0) face; the rate of deposition thus is maximum, while the deposited layer has good properties.

In order to choose the growth conditions of the monocrystalline layers in an ideal manner, a molar fraction of AsCl$_3$ is chosen which is in the proximity of $3 \times 10^{-2}$ and a growth face which makes an angle of 8° with the (1, 0, 0) face.

The use of this method for the manufacture of semiconductor devices enables, for example, a more rapid manufacture and with good properties of devices, such as field effect transistors. In this framework, Applicants have deposited a buffer layer of GaAs which is doped with approximately $10^{13}$ atoms per cc on a semi-insulating substrate, succeeded by a deposition of a thin active layer of GaAs, for example of 0.2 micron, doped with approximately $10^{17}$ atoms per cm$^3$ according to the method described in the present application.

Similarly, by using said method, applicants have obtained polycrystalline bodies of high purity while the growth is very rapid, on an average 5 to 6 times that of polycrystalline bodies obtained with molar fractions of AsCl$_3$ of $10^{-3}$. Furthermore, the resulting efficiency is in the order of 80% with respect to the arsenic used.

Of course, the above description is non-limiting and many variations are possible to those skilled in the art without departing from the scope of this invention.

What is claimed is:

1. A method of growing gallium arsenide crystals, comprising the steps of reacting a first gaseous phase containing hydrogen and arsenic trichloride with a liquid phase of gallium, said reaction forming a second gaseous phase from which the gallium arsenide is deposited, wherein the molar fraction of arsenic trichloride in said first gaseous phase is higher than $2 \times 10^{-2}$.

2. A method as claimed in claim 1, wherein the molar fraction of arsenic trichloride in said first gaseous phase is lower than $10^{-1}$.

3. A method as in claim 2, wherein the molar fraction of arsenic trichloride in said first gaseous phase is chosen to be equal to $3 \times 10^{-2}$.

4. A crystalline body obtained by using the method recited in claim 1.

5. A method of manufacturing a semiconductor device comprising a monocrystalline substrate and monocrystalline layer of gallium arsenide, said layers being deposited by reacting a first gaseous phase containing hydrogen and arsenic trichloride with a liquid phase of gallium, said reaction forming a second gaseous phase from which the gallium arsenide is deposited, wherein the molar fraction of arsenic trichloride in said first gaseous phase is higher than $2 \times 10^{-2}$ and wherein the growth face of said monocrystalline substrate on which said layers are deposited is a face that makes an angle of 6° to 12° with the (1, 0, 0) face.

6. A semiconductor device obtained by using the method recited in claim 5.

7. A method as claimed in claim 5, wherein the molar fraction of arsenic trichloride in said first gaseous phase is lower than $10^{-1}$.

* * * * *